United States Patent
Behrens et al.

(10) Patent No.: US 8,633,111 B2
(45) Date of Patent: Jan. 21, 2014

(54) COMPOSITION FOR POLISHING SURFACES OF SILICON DIOXIDE

(75) Inventors: Sven Holger Behrens, Atlanta, GA (US); Yaqian Liu, Ludwigshafen (DE); Günter Kern, Worms (DE); Heidrun Debus, Eisenberg (DE)

(73) Assignee: BASF SE, Ludwigshafen (DE)

( * ) Notice: Subject to any disclaimer, the term of this patent is extended or adjusted under 35 U.S.C. 154(b) by 596 days.

(21) Appl. No.: 12/521,653

(22) PCT Filed: Dec. 28, 2007

(86) PCT No.: PCT/EP2007/064596
§ 371 (c)(1),
(2), (4) Date: Nov. 9, 2010

(87) PCT Pub. No.: WO2008/080958
PCT Pub. Date: Jul. 10, 2008

(65) Prior Publication Data
US 2011/0045671 A1   Feb. 24, 2011

(30) Foreign Application Priority Data
Dec. 28, 2006   (DE) .................... 10 2006 061 891

(51) Int. Cl.
*H01L 21/302* (2006.01)
(52) U.S. Cl.
USPC ......... 438/692; 438/693; 252/79.1; 252/79.4; 216/89
(58) Field of Classification Search
USPC ............ 438/692, 693; 252/79.1, 79.4; 216/89
See application file for complete search history.

(56) References Cited

U.S. PATENT DOCUMENTS

| 6,428,392 | B1 | 8/2002 | Sunahara et al. |
| 6,533,850 | B1 | 3/2003 | Kaiser et al. |
| 6,616,514 | B1 * | 9/2003 | Edelbach et al. ............... 451/60 |
| 6,696,045 | B2 | 2/2004 | Yue et al. |
| 6,827,752 | B2 | 12/2004 | Nojo et al. |
| 6,971,945 | B2 | 12/2005 | Liu et al. |
| 2002/0039875 | A1 | 4/2002 | Kobayashi et al. |
| 2003/0124067 | A1 | 7/2003 | Yue et al. |
| 2003/0172594 | A1 * | 9/2003 | Castro et al. ..................... 51/307 |
| 2004/0231246 | A1 * | 11/2004 | Ferranti et al. .................. 51/309 |
| 2005/0287931 | A1 | 12/2005 | Saegusa et al. |
| 2007/0093187 | A1 * | 4/2007 | Takenouchi ................... 451/174 |
| 2007/0117737 | A1 * | 5/2007 | Artiga Gonzalez et al. .. 510/446 |
| 2007/0210278 | A1 * | 9/2007 | Lane et al. .................... 252/79.1 |
| 2007/0218811 | A1 * | 9/2007 | Kurata et al. ................... 451/28 |

FOREIGN PATENT DOCUMENTS

| DE | 10 2005 058 272 A1 | 7/2006 |
| EP | 0 373 501 A2 | 6/1990 |
| EP | 1 148 538 | 10/2001 |
| EP | 1 471 124 | 10/2004 |

(Continued)

OTHER PUBLICATIONS

Search Report issued on Sep. 3, 2013 in Taiwanese Application No. 096150933 filed on Dec. 28, 2007.

*Primary Examiner* — Binh X Tran
(74) *Attorney, Agent, or Firm* — Oblon, Spivak, McClelland, Maier & Neustadt, L.L.P.

(57) ABSTRACT

A composition for polishing surfaces comprises the following components:
a) at least one inorganic abrasive component (S) comprising a lanthanide oxide,
b) at least one organic dispersing-agent component based on polymer (P),
c) at least one organic gelling agent (G) such as gellan gum,
d) water as solution or dispersing medium, and
e) if appropriate further auxiliary and additive materials and has high stability.

20 Claims, 8 Drawing Sheets

(56) References Cited

FOREIGN PATENT DOCUMENTS

Figure 1:
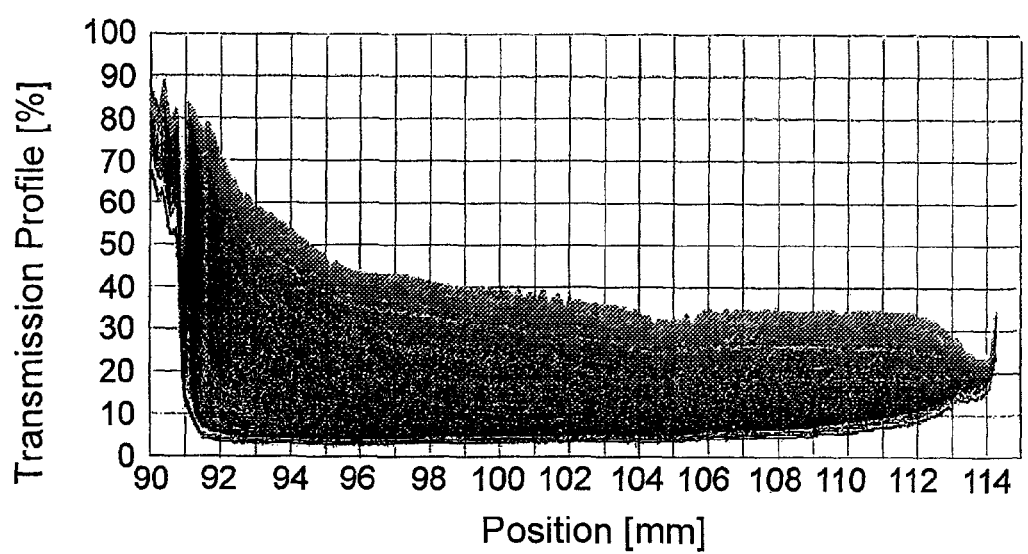

| | | |
|---|---|---|
| JP | 01-266179 | 10/1989 |
| JP | 10-287865 | 10/1998 |
| JP | 2000336344 | 12/2000 |
| JP | 2002-353175 | 12/2002 |
| JP | 2005206420 | 8/2005 |
| JP | 2006217836 | 8/2006 |
| WO | 01/14496 | 3/2001 |
| WO | 02/096999 | 12/2002 |
| WO | WO 2004/037934 A1 | 5/2004 |

* cited by examiner

COMPOSITION FOR POLISHING SURFACES OF SILICON DIOXIDE

The present invention relates to a stabilized composition for polishing surfaces preferably of semiconductor components, for example of silicon dioxide, to a process for polishing and also to the chemical mechanical planarization of semiconductor materials.

The ever smaller dimensions of components and devices and the increasing integration density of microelectronic circuits have also led to a reduction in the size of isolation/insulation structures. This reduction, however, leads to high requirements with regard to the reproducible formation of planar surfaces and structures which provide effective isolation/insulation while a minimal proportion of the substrate surface is covered.

Polishing, cleaning, grinding and planarizing frequently utilize aqueous abrasive slurries comprising solid particles in suspended form. In many cases, these particles have an elevated density compared with the surrounding liquid medium and therefore tend to sediment. Aqueous suspensions of inorganic abrasives are very widely used, for example.

The particles in aqueous suspensions of inorganic abrasives often have multiple times the density of water. Typical values range for example from close to 2.2-2.7 $g/cm^3$ for silicon dioxide to about 3.4 $g/cm^3$ for silicon nitride and up to 15 $g/cm^3$ for tungsten carbide. As well as the density of the abrasive particles, their size and shape also have an influence on the success of the polishing operation.

For an efficient aftertreatment of the materials treated with such slurries, the slurry compositions have to have a high and preferably material-specific removal rate and substantially avoid scratches; on the other hand, they should be quickly and fully removable from the surface of the material, which is why a low viscosity is one of the essential requirements of the slurries used.

For instance, abrasive slurries for chemical mechanical planarization (CMP), an important processing step in the production of computer chips, typically have a viscosity of not more than 5 mPas.

Since separation in the suspensions used may lead to a change in viscosity, it is desirable to achieve stabilization of these compositions and to control separation and/or the sedimentation of slurry particles without significantly raising the viscosity. But precisely this is difficult in using abrasives of high density. Various polymeric additives are described in the prior art.

U.S. Pat. No. 6,971,945 discloses a preparation for polishing surfaces of semiconductors wherein an acidic suspension comprising an abrasive, an oxidizing agent, an inorganic salt and a complexing agent (for example phthalic acid) is used.

DE-A 10 2005 058 272 presents a process for multistage chemical mechanical planarization of surfaces wherein various dispersions of metal oxide abrasives in water (together with auxiliaries) are applied in succession to silica surfaces.

EP-A 0 373 501 discloses the use of water-soluble polymers in polishing mixtures, these polymers for example having a molecular weight of 100 000 or more and consisting of polyvinylpyrrolidone or for example a graft copolymer of guar gum and vinyl monomers. Colloidal silicate is used as the abrasive in the polishing mixtures described in EP-A 0 373 501; that is, an abrasive having a comparatively low density.

U.S. Pat. No. 6,696,045 discloses dentifrices.

The preparations for tooth cleaning described in U.S. Pat. No. 6,696,045 comprise beside a polyphosphate component a metal salt component and an organic gelling agent based on polysaccharides. However, the use of cerium oxide in combination with other components of the inventive composition is not described.

US 2005/0287931 presents a cerium oxide comprising polishing composition which comprises an anionic dispersing-agent and a non-ionic surface active compound. The abrasive particles used therein have a mean particle size of 0.01 µm to 10 µm.

US 2003/0124067 discloses tooth cleaning preparation.

WO 2004/037934 provide also polishing compositions based on cerium oxide which can comprise a disperging-agent.

It is an object of the present invention to provide durable and economical stabilization of aqueous compositions for polishing surfaces.

We have found that this object was achieved, surprisingly, by the incorporation of small amounts of specific gelling or thickening agents in the aqueous composition.

Various gelling agents are known from food technology to have in some instances an appreciable influence on the viscosity of solutions. Examples of such gelling agents include agar-agar, pectins, polyoses, alginates, starch, dextrins, gelatin and casein.

It is believed that the specific gelling agents (G) to be used according to the present invention form weak networks in concentrations below those which cause a steep increase in viscosity. These networks are capable of keeping particles suspended in a quiescent liquid, but, on the other hand, are broken by the shearing forces acting in moving liquids and therefore do not significantly impair flowability.

In a first aspect, the present invention provides a composition for polishing a surface, for example in the case of a semiconductor component. Planarizing the surface may utilize an aqueous composition (Z) comprising at least one gelling agent (G) as well as an abrasive component (S).

The present invention also provides a process for polishing a surface (O) of semiconductor components wherein first an aqueous composition (Z) is applied to the surface (O) to be polished, this composition (Z) especially comprising the following components:

a) at least one inorganic abrasive component (S) comprising a lanthanide oxide,
b) at least one organic dispersing-agent component based on polymer (P),
c) at least one organic gelling agent (G) based on polysaccharides,
d) water as solution or dispersing medium, and also
e) if appropriate further auxiliary and additive materials.

In the course of the polishing operation the abrasion products formed are removed from the polished surface (O) together with the components of the composition (Z) by a simple rinsing operation (V) after attainment of the desired planarization (P).

The surface (O) to be polished may consist of different materials, in particular the common materials for semiconductor components. It preferably consists for example of silicon oxide, which can be removed with high efficiency and accuracy.

One embodiment of the present invention utilizes a composition (Z) comprising an inorganic lanthanide oxide, in particular a cerium oxide, preferably cerium dioxide, as inorganic abrasive component (S). Useful lanthanides include in principle lanthanum and the subsequent elements (58 to 70), and the density of suitable oxide compounds is preferably in the range from 3.5 to 9 $g/cm^3$, and especially in the range from 5.0 to 8.0 $g/cm^3$.

One embodiment of the present invention utilizes a composition (Z) comprising a combination of cerium oxide with zirconium oxide and/or manganese oxide as inorganic abrasive component (S).

A further embodiment of the present invention utilizes a composition (Z) comprising a carboxylic acid polymer as organic dispersing-agent component (P). The organic polymeric component (P) may comprise for example a copolymer comprising the monomers acrylic acid, methacrylic acid and/or maleic acid.

A preferred embodiment of the present invention utilizes a composition (Z) comprising gellan gum as organic gelling agent. The organic gelling agent in the composition (Z) may comprise for example from 0.001% to 1.0% by weight, preferably from 0.01% to 1.0% by weight, and especially 0.05% to 0.5% by weight of gellan gum. The gelling agent gellan gum will prove particularly advantageous for stabilizing the compositions (Z).

The present invention also provides a process for polishing a surface wherein the composition (Z) comprises gellan gum as organic gelling agent and cerium oxide as inorganic abrasive component (S). This combination will provide particularly good durability to the composition.

The present invention also provides a composition (Z) comprising further auxiliary and additive materials, for example a polyvinylpyrrolidone, cationic compounds, phthalic acid and/or zwitterionic compounds.

One embodiment of the present invention provides an aqueous composition (Z) comprising the following components:
  0.02% to 6% by weight of the abrasive cerium dioxide,
  0.01% to 5% by weight of at least one carboxylic acid polymer,
  0.01% to 1% by weight of at least one gelling agent (G), in particular gellan gum.

The composition (Z) may optionally also comprise for example, as auxiliary and additive materials:
  0% to 10% by weight of polyvinylpyrrolidone,
  0% to 5% by weight of a cationic compound,
  0% to 1% by weight of phthalic acid or salts thereof,
  0% to 5% by weight of a zwitterionic compound
  and also as solution or dispersing medium water (ad 100%).

The present invention further provides a composition for polishing surfaces comprising the following components:
  a) at least one inorganic abrasive component (S) comprising a lanthanide oxide, preferably cerium oxide,
  b) at least one organic dispersing-agent component (P), preferably an acrylic acid copolymer,
  c) at least one organic gelling agent (G), preferably gellan gum,
  d) water as solution or dispersing medium, and also
  e) if appropriate further auxiliary and additive materials.

With regard to the components of the composition for polishing a surface, reference is made to the above description.

Preference is given to a composition comprising a lanthanide oxide as inorganic abrasive component (S) and gellan gum as organic gelling agent (G).

The present invention also relates very generally to the use of gellan gum for stabilizing aqueous compositions for polishing surfaces.

The present invention's composition for polishing comprises preferably 0.2% to 6% by weight of the abrasive component (S) in order that silica removal may be facilitated. The abrasive is popularly used in an amount of 0.5% by weight to 5% by weight.

The abrasive preferably has an average particle size of 50 to 200 nanometers (nm), in particular of 80 to 150 nm. For the purposes of this description, particle size refers to the average particle size of the abrasive. A preferred abrasive is cerium dioxide having average particle sizes in the range from 80 to 150 nm. As the size of the abrasive decreases to less than 80 nm there is a tendency for the planarizing effect of the polishing composition to improve, but also for the removal rate of the abrasion products to decrease. The shape of the particles is preferably substantially round, in particular with few edges if any. Similarly, differences in suitability were found with regard to the crystallinity and the surface charge of the particles used.

Examples of known abrasives comprise inorganic oxides, inorganic hydroxides, metal nitrides, metal borides, metal carbides and mixtures comprising at least one of the aforementioned materials. Suitable inorganic oxides comprise for example silica ($SiO_2$), alumina ($Al_2O_3$), zirconium oxide ($ZrO_2$) and manganese oxide ($MnO_2$). According to the present invention, however, cerium oxide ($CeO_2$) and/or another lanthanide oxide is used as abrasive. Cerium dioxide has a high density (of about 7) and preferred abrasion properties.

The present invention also provides compositions comprising cerium oxide in combinations further comprising at least one of the aforementioned oxides. Modified forms of these inorganic oxides such as for example polymer-coated inorganic oxidic particles and inorganically coated particles can similarly be used, if appropriate. Suitable metal carbides, borides and nitrides comprise for example silicon carbide, silicon nitride, silicon carbonitride (SiCN), boron carbide, tungsten carbide, zirconium carbide, aluminum boride, tantalum carbide, titanium carbide or combinations comprising at least one of the aforementioned metal carbides, borides and nitrides. If appropriate, diamond may also be used as an additional abrasive. The preferred abrasive is cerium oxide as sole component. It is similarly preferable to use cerium oxide combined with another lanthanide oxide.

Various polymers and copolymers are useful as organic dispersing components (P). The present invention's composition (Z) comprises, preferably, 0.01% to 5% by weight of a carboxylic acid polymer which serves as a dispersing agent for the abrasive particles.

Preferably, the composition comprises 0.05% to 1.5% by weight of a carboxylic acid polymer. The polymer preferably has a number average molecular weight of 4000 to 1 500 000.

Blends of carboxylic acid polymers of higher and lower molecular weight can also be used. These carboxylic acid polymers are generally present in solution, but can also be present in an aqueous dispersion. The carboxylic acid polymer may advantageously serve as a dispersing agent for the abrasive particles. The number average molecular weight of the aforementioned polymers can be determined by GPC for example. The carboxylic acid polymers are preferably formed from unsaturated monocarboxylic acids and unsaturated dicarboxylic acids. Typical unsaturated monocarboxylic acid monomers comprise 3 to 6 carbon atoms and comprise acrylic acid, oligomeric acrylic acid, methacrylic acid, crotonic acid and vinylacetic acid. Typical unsaturated dicarboxylic acids comprise 4 to 8 carbon atoms and comprise their anhydrides, examples comprising maleic acid, maleic anhydride, fumaric acid, glutaric acid, itaconic acid, itaconic anhydride and cyclohexene dicarboxylic acid. Water soluble salts of the aforementioned acids can also be used.

Of particular suitability are "poly(meth)acrylic acids" having an average molecular weight of about 1000 to 1 500 000, preferably 3000 to 250 000 and more preferably 20 000 to 200

000. The term "poly(meth)acrylic acid" herein is defined as polymers of acrylic acid, polymers of methacrylic acid or copolymers of acrylic acid and methacrylic acid. These may also comprise maleic acid as a monomer component. Various blends of poly(meth)acrylic acids of differing molecular weight are also suitable.

Useful organic polymeric components (P) further include carboxyl-containing copolymers and terpolymers in each of which the carboxyl component comprises for example 5% to 75% by weight of the polymer.

Typical examples of such polymers are polymers formed from (meth)acrylic acid and acrylamide or methacrylamide; polymers formed from (meth)acrylic acid and styrene and other vinylaromatic monomers; polymers formed from alkyl (meth)acrylates (esters of acrylic or methacrylic acid) and a mono- or dicarboxylic acid, for example acrylic or methacrylic acid or itaconic acid; polymers formed from substituted vinylaromatic monomers having substituents such as for example halogen (i.e., chlorine, fluorine, bromine), nitro, cyano, alkoxy, haloalkyl, carboxyl, amino, aminoalkyl, and an unsaturated mono- or dicarboxylic acid and an alkyl(meth)acrylate;

Polymers formed from monoethylenically unsaturated monomers comprising a nitrogen ring, examples being vinylpyridine, alkylvinylpyridine, vinylbutyrolactam, vinylcaprolactam, and an unsaturated mono- or dicarboxylic acid; polymers formed from olefins, for example propylene, isobutylene or long-chain alkylolefins having 10 to 20 carbon atoms, and an unsaturated mono- or dicarboxylic acid, polymers formed from vinyl alcohol esters, for example vinyl acetate and vinyl stearate, or vinyl halides, for example vinyl fluoride, vinyl chloride, vinylidene fluoride, or vinylnitriles, for example acrylonitrile and methacrylonitrile, and an unsaturated mono- or dicarboxylic acid; polymers formed from alkyl(meth)acrylates having 1 to 24 carbon atoms in the alkyl group and an unsaturated monocarboxylic acid, for example acrylic acid or methacrylic acid. These are but a few examples from the multiplicity of polymers useful in the composition of the present invention.

Various commercially available gelling agents can in principle be used in the polishing composition of the present invention, examples being agar-agar, pectins, polyoses, alginates, starch, dextrins, gelatin and casein, but polysaccharides and especially the product gellan gum will prove particularly advantageous.

Gellan gum is an odorless, cream-colored powder which is readily soluble. It is a multifunctional gelling agent. Gellan gum is a water-soluble polysaccharide, produced by the aerobic fermentation of the microorganisms *Sphingomonas elodea*. Gellan gum uses include as a thickener and stabilizer in foods.

The optional polyvinylpyrrolidone preferably has an average molecular weight of 100 g/mol to 1 000 000 g/mol. The weight average molecular weight of the polyvinylpyrrolidone is particularly in the range from 500 to 800 000 g/mol, determined by gel permeation chromatography (GPC). Preferably, the polyvinylpyrrolidone has a weight average molecular weight of 500 to 500 000 g/mol. It is more preferable for the weight average molecular weight of the polyvinylpyrrolidone to be in the range from about 1500 to about 100 000 g/mol.

The compounds used in the compositions (Z) of the present invention endow solutions comprising water as balance with an effectiveness which extends over a wide pH range. The suitable pH range of these solutions extends from 0.4 to 9. In addition, the compositions (Z) are prepared by using preferably deionized water in order that adventitious impurities may be limited.

The pH is preferably from 4.5 to 8 and more preferably from 5.5 to 7.5. The acids used for setting the pH of the composition of the present invention include for example nitric acid, sulfuric acid, hydrochloric acid and phosphoric acid. Examples of bases used for setting the pH of the compositions (Z) of the present invention include for example ammonium hydroxide and potassium hydroxide.

The composition (Z) optionally further comprises 0% to 5% by weight of a zwitterionic compound to promote planarization and suppress nitride removal. The composition preferably comprises 0.01% to 1.5% by weight of a zwitterionic compound. The zwitterionic compound of the present invention may advantageously promote planarization and suppress nitride removal.

The composition (Z) of the present invention may optionally further comprise 0% to 5% by weight of a cationic compound as an auxiliary component. The composition preferably comprises an optional 0.01% to 1.5% by weight of a cationic compound. The cationic compound of the present invention may advantageously promote planarization, regulate wafer removal time, and serve to suppress oxide removal. Preferred cationic compounds comprise alkylamines, arylamines, quaternary ammonium compounds and alcoholamines.

Examples of cationic compounds comprise methylamine, ethylamine, dimethylamine, diethylamine, trimethylamine, triethylamine, aniline, tetramethylammonium hydroxide, tetraethylammonium hydroxide, ethanolamine and propanolamine.

Optionally, the composition (Z) of the present invention may further comprise 0% to 1% by weight of a complexing agent.

Preferably, the composition comprises 0.01% to 0.5% by weight of a complexing agent. Examples of complexing agents comprise carbonyl compounds (for example acetylacetonates and the like), simple carboxylates (for example acetates, arylcarboxylates and the like), carboxylates comprising one or more hydroxyl groups (for example glycolates, lactates, gluconates, gallenic acid and salts thereof and the like), di-, tri- and polycarboxylates (for example oxalates, phthalates, citrates, succinates, tartrates, malates, edetates (for example disodium EDTA), mixtures thereof, carboxylates comprising one or more sulfonic and/or phosphonic acid groups.

Other suitable complexing agents comprise for example di-, tri- or polyalcohols (for example ethylene glycol, pyrocatechol, pyrogallol, tannic acid and the like) and phosphate-containing compounds (for example phosphonium salts and phosphonic acids). The complexing agent is preferably phthalic acid and/or salts thereof. Preferred phthalate salts comprise ammonium hydrogen phthalate and potassium hydrogen phthalate and mixtures thereof.

The present invention further provides a process for producing a composition for polishing surfaces, wherein the following components:
  a) at least one inorganic abrasive component (S) comprising a lanthanide oxide,
  b) at least one organic dispersing-agent component based on polymer (P),
  c) at least one organic gelling agent (G) based on polysaccharides,
  d) water as solution or dispersing medium, and also
  e) if appropriate further auxiliary and additive materials are mixed with one another at a temperature in the range from 10 to 95° C. This can be effected by means of an ultrasonic probe for example. The mixing operation generally takes between 1 minute and several hours (5 h for example). Preferably the components S and P are first mixed in water and then the gelling agent G and also the further components are added.

The present invention also concerns a process for polishing semiconductor components or structures. The composition (Z) can be used as an abrasive slurry in the first step. The slurry can give significantly faster polishing in an upper region of an oxide film than in a lower region of an oxide film. More particularly, the polishing operation can be carried out selectively with regard to the material, so that the removal of silicon nitride can be distinctly less than that of silicon oxide.

The polishing speed of the composition preferably decreases when the step height of the oxide is reduced and a planarization has been achieved. A preferred embodiment of the present invention may utilize an endpoint signal to trigger the end of the first step.

Various methods can be used, including endpoint signals based on friction or motor current. The point at which planarization is attained can be determined on the basis of characteristic features of the endpoint signal.

At the end of the first step, the surface of the semiconductor component is characterized by an essentially planar oxide layer covering the entire wafer. In the second step, then, the abrasive preparation is rinsed off. The endpoint of the second step can also be determined by simple tests.

The composition (Z) optionally further comprises a polyvinylpyrrolidone for improved dishing performance.

More particularly, the present invention provides an aqueous composition useful for polishing silicon dioxide on a semiconductor wafer.

The composition comprises in particular 0.01-0.1% by weight of gellan gum, 0.01% to 5% by weight of a carboxylic acid polymer, 0.02% to 6% by weight of abrasive, 0% to 10% by weight of polyvinylpyrrolidone, 0% to 5% by weight of a cationic compound, 0% to 1% by weight of phthalic acid and salts thereof, 0% to 5% by weight of a zwitterionic compound and water as balance.

The point at which planarization is attained can be determined on the basis of characteristic features of an endpoint signal. By coupling the endpoint signal with the "inhibiting" slurry of the first step, improved planarization properties can be maintained, while compared with the operation in a true stop-at-plane mode higher polishing speeds and significantly shorter processing times are obtained.

EXAMPLE 1

Measuring the Dispersion Stability of Inventive Preparations Using Lumifuge 116

A Lumifuge (manufacturer: Lum GmbH, 12489 Berlin) is an analytical centrifuge which detects separation processes during centrifugation across the entire sample height. At any one time, 8 samples can be investigated for example.

The measuring principle of a Lumifuge relies on a microprocessor-controlled analytical centrifuge which makes it possible to describe the separation behavior of suspensions and emulsions in original concentrations. Centrifugation at 12 to 1200 times gravity induces increased migration of particles or constituents of the inner phase. Local changes in particle concentration are detected by changes in light transmission.

Plotting a graph of the transmission as a function of the local position allows statements to be made about corresponding transmission profiles. Regions having well commixed dispersions scatter and absorb light, so that transmission is low. In contrast, clarification of the mixture allows more light to reach the measuring (CCD) cell and hence transmission increases. Suitable algorithms to compute particle size distribution make it possible to evaluate any sedimentation, flotation or clarification that may occur.

Samples are analyzed at defined intervals between 10 seconds to 24 hours. The primary results are corresponding sequences of profiles. These individual sequences are then integrated by software to depict the rate of separation processes. To quantify separation, light transmission through the cuvette is measured across the entire sample height. To this end, the cuvette is irradiated with a parallel flash of light of wavelength 800 to 900 nm.

Disperse materials diffract or absorb light, whereas it can pass without hindrance through the clear phase. An optoelectronic sensor, the CCD cell, is situated in the continuing path from the light source and the cuvette, and captures light intensity as a function of cuvette height.

This locally resolved measurement of light transmission is repeated at intervals of 10 seconds. The separation process is thereby observed directly during centrifugation. The separation curve is the graphic depiction of the phase boundary as a function of time. The slope of the separation curves reflects the change in clarification. From it, an electronic data-processing program computes the clarification (% transmission per second).

EXAMPLE 2

Improving the Stability of the Inventive Preparations

Slurries

Various ready-to-sell CMP slurries were each admixed with 0.2% by weight of gellan gum (from: Sigma-Aldrich Chemie GmbH, Taufkirchen, Germany) and sample stability was measured.

The gellan gum was added at room temperature. The sample was heated to 85-95° C. and stirred in a closed system for 3 to 5 hours. This was followed by cooling to room temperature with stirring.

FIGS. 1 to 6 show the results of Lumifuge stability tests on three CMP slurries each without (FIG. 1, FIG. 3, FIG. 5) and with (FIG. 1, FIG. 4, FIG. 6) addition of gellan gum. In these figures the transmission (in %) is given as function of the position (in mm).

Figure 2:
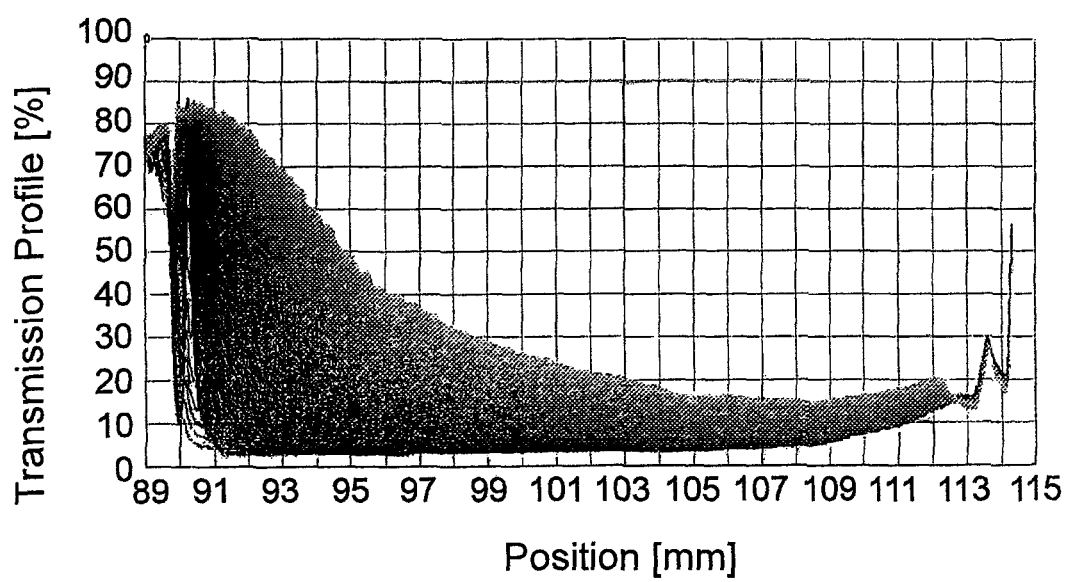
Figure 3:
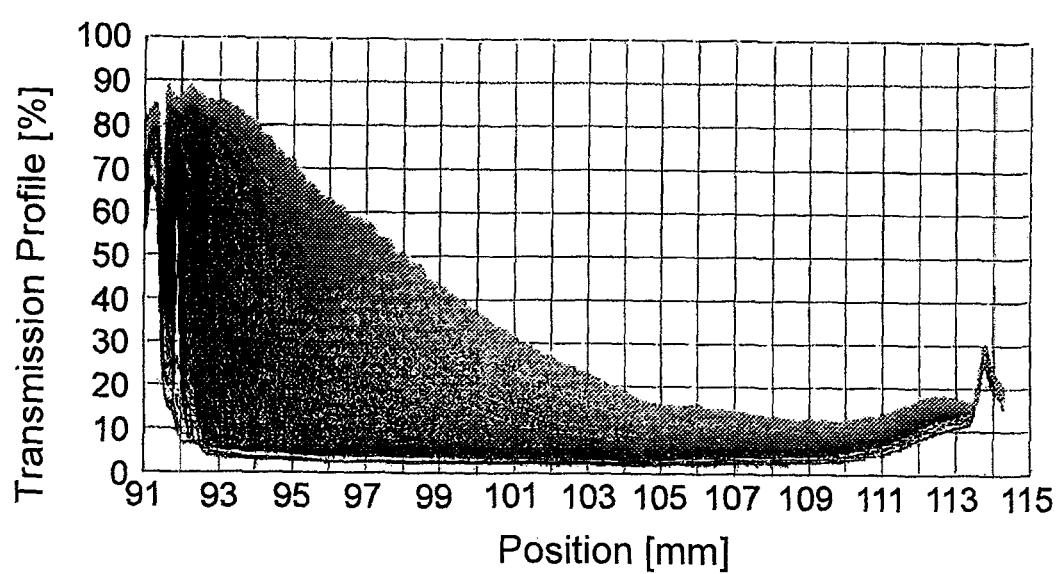
Figure 4:
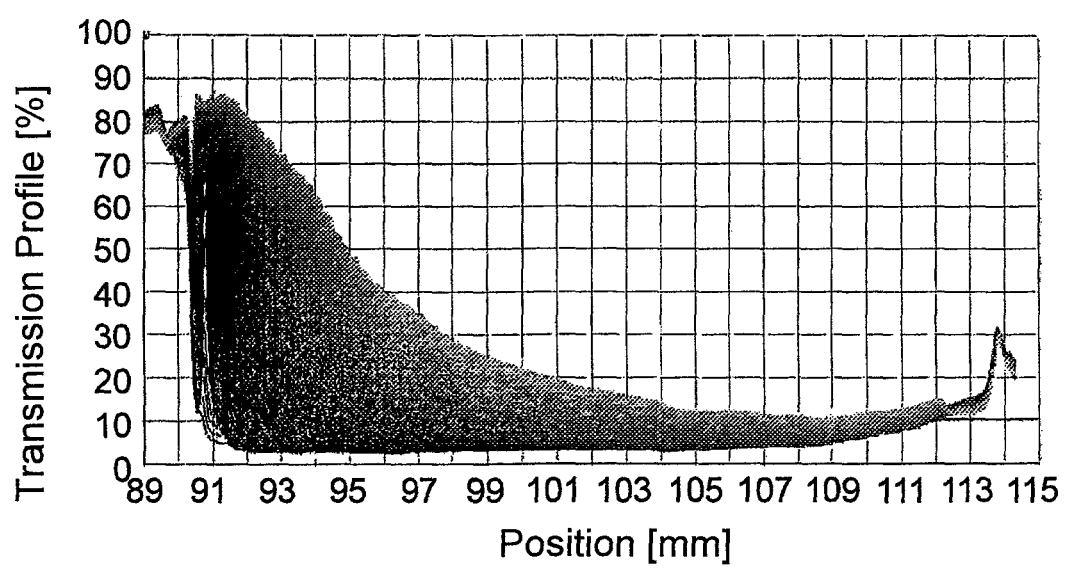

FIGS. 1 and 2 utilized the product "DP-7080HP" (R5; from: Nyacol Nano Technologies Inc; Ashland, USA) and FIGS. 3 and 4 utilized the product "DP-7090S" (R6; from: Nyacol Nano Technologies Inc.).

Figure 5:
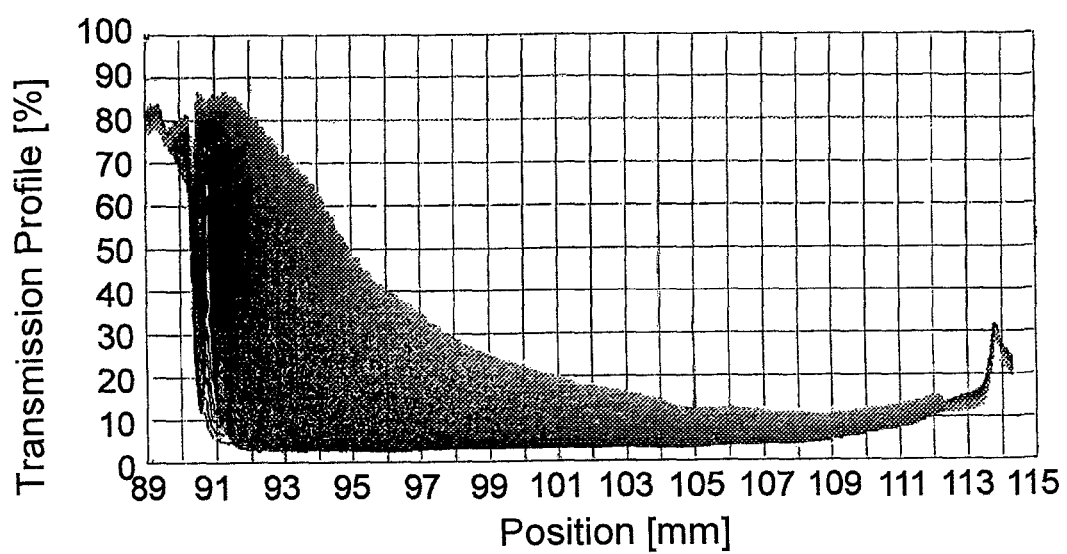
Figure 6:
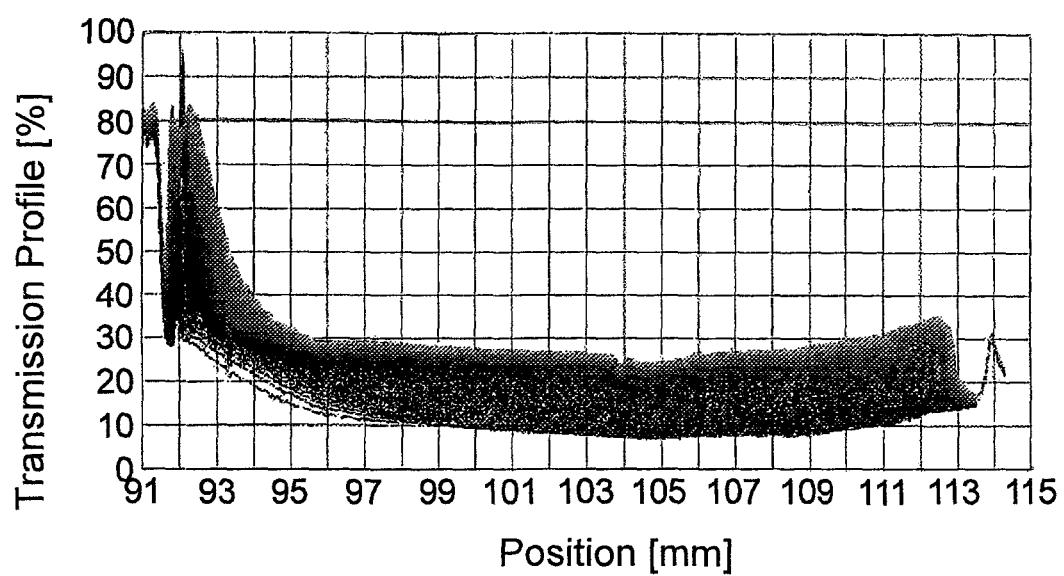

FIGS. 5 and 6 utilized the product "Sokolan CP5" (R9; from: BASF).

Determining CMP slurry stability using a Lumifuge 116 indicates distinct stabilization of the slurries through the addition of even small amounts of gellan gum.

Figure 7:
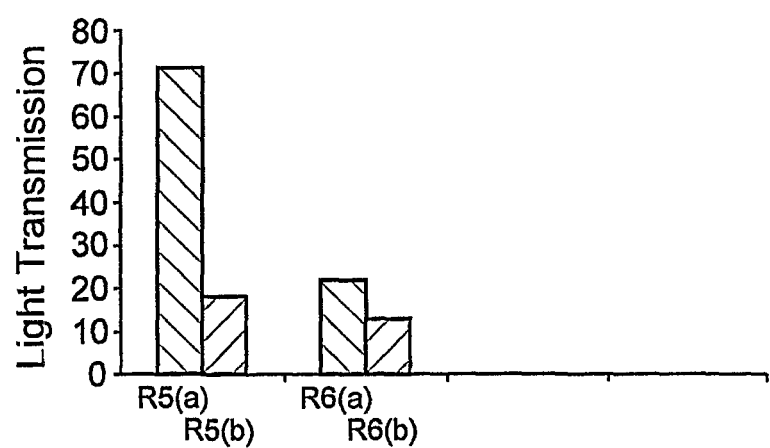
Figure 8:
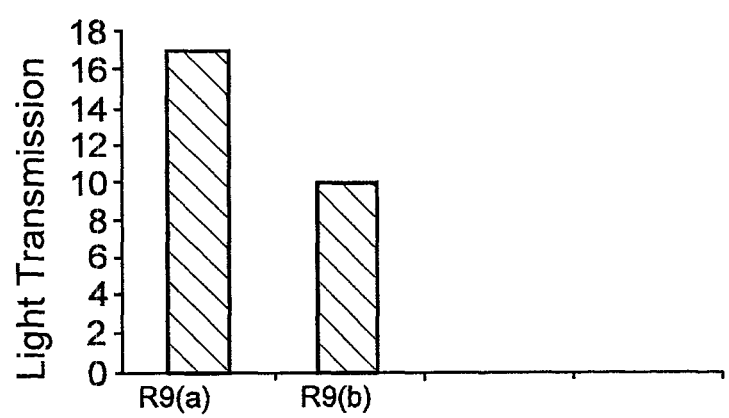

The measured improvement in stability is illustrated in FIGS. 7 and 8. The light transmission is shown each after 3 days for slurries with and without gellan gum in the composition.

FIG. 7 shows a 75.7% stability improvement through the addition of the gelling agent for the R5 sample. A 44% stability improvement is shown for the R6 sample. FIG. 8 shows the stability improvement (transmission change) of "Sokolan CP5" with gellan gum.

EXAMPLE 3

Improving the Stability of an Inventive Composition

CMP Slurry from a Powder

A $CeO_2$ powder was formulated to form a stable slurry as follows:

To completely ion-free water are added 0.1% by weight of a copolymer of acrylic acid and maleic acid ("Sokalan CP5" dispersant from BASF) and 5% by weight of a cerium dioxide powder (from Degussa, "VP AdNano Ceria 50") with stirring.

After 30 minutes of dispersing with an ultrasonic probe at room temperature, 0.2% by weight of gellan gum powder (from: Sigma-Aldrich Chemie GmbH, Taufkirchen, Germany) was stirred into the sample using a magnetic stirrer. The sample is stirred in a closed vessel for one hour at room temperature and then for 4 hours at 90° C. and is then stored at room temperature.

Sedimentation stability is determined via light transmission in a Lumifuge 116 (speed 1500 rpm; integration time 1000 seconds) and compared with the stability of a reference sample without gellan gum. The results are shown in FIG. 8.

A 46% decrease in the accumulative transmission of the samples admixed with gellan gum demonstrates a distinct improvement in its sedimentation stability due to the specific gelling agent.

EXAMPLE 4

The example 3 composition of 94.7% of water, 0.1% of copolymer, 5% of cerium dioxide, 0.2% of gellan gum can be applied to the silicon dioxide surface of a semiconductor component and used for polishing the surface.

The invention claimed is:

1. A composition for polishing surfaces comprising the following components:
    a) at least one inorganic abrasive component (S) comprising a lanthanide oxide having a density in the range from 3.5 to 9 $g/cm^3$,
    b) at least one organic dispersing-agent component based on polymer (P),
    c) at least one organic gelling agent (G) based on gellan gum,
    d) water as solution or dispersing medium, and
    e) optionally additional auxiliary and additive materials.

2. The composition for polishing a surface according to claim 1 comprising as the inorganic abrasive component (S) a combination of cerium oxide with zirconium oxide and/or manganese oxide.

3. The composition for polishing a surface according to claim 1 comprising the lanthanide oxide having a density in the range from 5.0 to 8.0 $g/cm^3$ the as inorganic abrasive component (S).

4. The composition for polishing a surface according to claim 1 comprising cerium oxide or a combination of cerium oxide with zirconium oxide and/or manganese oxide as the inorganic abrasive component (S).

5. The composition for polishing a surface according to claim 1 comprising a carboxylic acid polymer as the organic dispersing component (P).

6. The composition for polishing a surface according to claim 1 comprising a copolymer comprising the monomers acrylic acid, methacrylic acid and maleic acid as the organic dispersing component (P).

7. The composition for polishing a surface according to claim 1 comprising from 0.001% to 1.0% by weight of gellan gum as the organic gelling agent (G).

8. The composition for polishing a surface according to claim 1 comprising cerium dioxide as the inorganic abrasive component (S).

9. The composition for polishing a surface according to claim 1 comprising polyvinylpyrrolidone, cationic compounds, phthalic acid and/or zwitterionic compounds as additional auxiliary and additive materials.

10. The composition for polishing a surface according to claim 1 comprising the following components:
    0.02% to 6% by weight at least of the inorganic abrasive component (S),
    0.01% to 5% by weight at least of a carboxylic acid polymer as the organic dispersing-agent component based on polymer (P),
    0.01% to 1% by weight at least of the organic gelling agent (G)
    and also, optionally, as auxiliary and additive materials
    0% to 10% by weight of polyvinylpyrrolidone,
    0% to 5% by weight of a cationic compound,
    0% to 1% by weight of phthalic acid or salts thereof,
    0% to 5% by weight of a zwitterionic compound
    and also water as solution or dispersing medium (ad 100%).

11. A process for polishing a surface (O) of a semiconductor component wherein first an aqueous composition (Z) is applied to the surface (O) to be polished, said aqueous composition (Z) comprising the following components:
    a) at least one inorganic abrasive component (S) comprising a lanthanide oxide having a density in the range from 3.5 to 9 $g/cm^3$,
    b) at least one organic dispersing-agent component based on polymer (P),
    c) at least one organic gelling agent (G) based on gellan gum,
    d) water as solution or dispersing medium, and
    e) optionally additional auxiliary and additive materials,
    and wherein abrasion products formed in the course of the polishing operation can be removed from the polished surface (O) together with the components of the aqueous composition (Z) by a simple rinsing operation (V) after attainment of planarization.

12. The process for polishing a surface according to claim 11 wherein the surface (O) consists of silicon oxide or silicon nitride.

13. The process for polishing a surface according to claim 11 wherein the composition (Z) comprises cerium oxide as the inorganic abrasive component (S).

14. The process for polishing a surface according to claim 11 wherein the aqueous composition (Z) comprises cerium oxide combined with zirconium oxide and/or manganese oxide as the inorganic abrasive component (S).

15. The process for polishing a surface according to claim 11 wherein the aqueous composition (Z) comprises a carboxylic acid polymer as the organic dispersing-agent component (P).

16. The process for polishing a surface according to claim 11 wherein the aqueous composition (Z) comprises a copolymer comprising the monomers acrylic acid, methacrylic acid and/or maleic acid as the organic dispersing-agent component (P).

17. The process for polishing a surface according to claim 11 wherein the aqueous composition (Z) comprises from 0.001% to 1.0% by weight of gellan gum as the organic gelling agent (G).

18. The process for polishing a surface according to claim 11 wherein the aqueous composition (Z) comprises from 0.01% to 1.0% by weight of gellan gum as the organic gelling agent (G).

19. The process for polishing a surface according to claim 11 wherein the aqueous composition (Z) comprises cerium oxide as the inorganic abrasive component (S).

20. The process for polishing a surface according to claim 11 wherein the aqueous composition (Z) comprises polyvinylpyrrolidone, cationic compounds, phthalic acid and/or zwitterionic compounds as additional auxiliary and additive materials.

* * * * *